(12) United States Patent
Atanasov et al.

(10) Patent No.: US 12,720,778 B2
(45) Date of Patent: Aug. 25, 2026

(54) INTEGRATED CIRCUITS WITH HIGH DIELECTRIC CONSTANT INTERFACIAL LAYERING

(71) Applicant: Intel Corporation, Santa Clara, CA (US)

(72) Inventors: Sarah Atanasov, Beaverton, OR (US); Nazila Haratipour, Portland, OR (US); Sou-Chi Chang, Portland, OR (US); Shriram Shivaraman, Hillsboro, OR (US); Uygar E. Avci, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 312 days.

(21) Appl. No.: 17/485,310

(22) Filed: Sep. 24, 2021

(65) Prior Publication Data

US 2023/0097184 A1 Mar. 30, 2023

(51) Int. Cl.
*H10D 1/68* (2025.01)
*H10B 53/30* (2023.01)

(52) U.S. Cl.
CPC ............ *H10D 1/696* (2025.01); *H10B 53/30* (2023.02)

(58) Field of Classification Search
CPC ......... H01L 28/75; H01L 28/55; H01L 28/56; H10B 53/30; H10D 1/692; H10D 1/694; H10D 1/696; H10D 1/682; H10D 1/684
See application file for complete search history.

(56) References Cited

U.S. PATENT DOCUMENTS

| | | | | |
|---|---|---|---|---|
| 2001/0021554 | A1* | 9/2001 | Hopfner | H10B 53/00<br>438/513 |
| 2020/0194443 | A1* | 6/2020 | Lin | H10D 1/684 |
| 2020/0212055 | A1* | 7/2020 | Lin | H10B 53/30 |
| 2020/0235243 | A1 | 7/2020 | Avci | |
| 2020/0286984 | A1 | 9/2020 | Chang | |

OTHER PUBLICATIONS

Search Report from European Patent Application No. 22185111.6, mailed Dec. 14, 2023, 9 pgs.

* cited by examiner

*Primary Examiner* — Thanhha S Pham
(74) *Attorney, Agent, or Firm* — Schwabe, Williamson & Wyatt, P.C.

(57) ABSTRACT

Embodiments of the present disclosure are directed to advanced integrated circuit structure fabrication and, in particular, integrated circuits with high dielectric constant (HiK) interfacial layering between an electrode and a ferroelectric (FE) or anti-ferroelectric (AFE) layer. Other embodiments may be disclosed or claimed.

24 Claims, 4 Drawing Sheets

INTEGRATED CIRCUITS WITH HIGH DIELECTRIC CONSTANT INTERFACIAL LAYERING

TECHNICAL FIELD

Embodiments of the disclosure are in the field of advanced integrated circuit structure fabrication and, in particular, integrated circuits with high dielectric constant (HiK) interfacial layering between an electrode and a ferroelectric (FE) or anti-ferroelectric (AFE) layer.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory or logic devices on a chip, lending to the fabrication of products with increased capacity. The drive for ever-more capacity, however, is not without issue. The necessity to optimize the performance of each device becomes increasingly significant. Embodiments of the present disclosure address these and other issues.

DESCRIPTION OF THE EMBODIMENTS

Figure 1A:
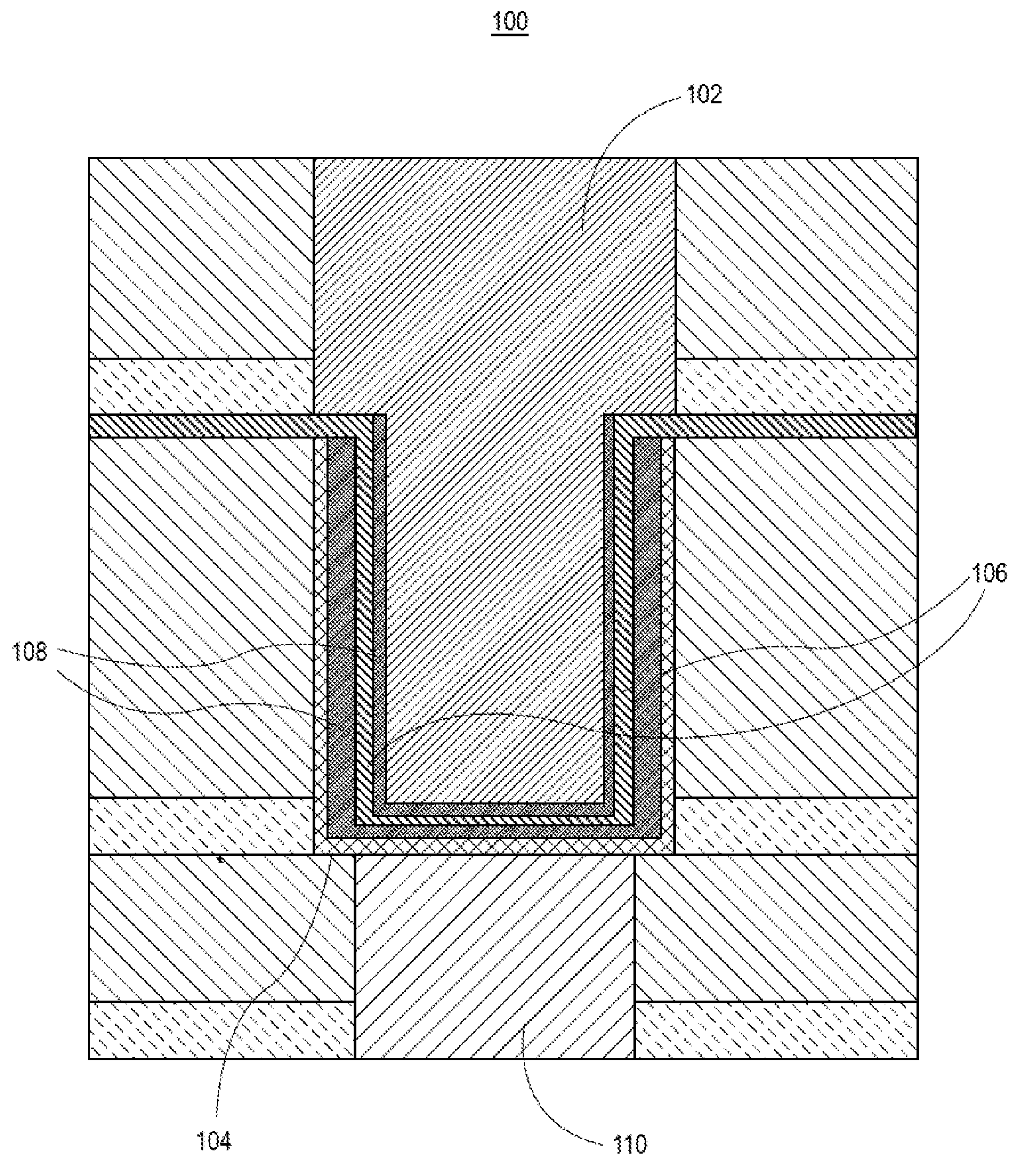
FIGS. 1A, 1B, and 1C are cross-sectional views of integrated circuit (IC) structure, in accordance with an embodiment of the present disclosure.

In some embodiments, integrated circuits with high dielectric constant (HiK) interfacial layering between an electrode and a ferroelectric (FE) or anti-ferroelectric (AFE) layer are described. In the following description, numerous specific details are set forth, such as specific integration and material regimes, in order to provide a thorough understanding of embodiments of the present disclosure. It will be apparent to one skilled in the art that embodiments of the present disclosure may be practiced without these specific details. In other instances, well-known features, such as integrated circuit design layouts, are not described in detail in order to not unnecessarily obscure embodiments of the present disclosure. Furthermore, it is to be appreciated that the various embodiments shown in the Figures are illustrative representations and are not necessarily drawn to scale.

The following detailed description is merely illustrative in nature and is not intended to limit the embodiments of the subject matter or the application and uses of such embodiments. As used herein, the word “exemplary” means “serving as an example, instance, or illustration.” Any implementation described herein as exemplary is not necessarily to be construed as preferred or advantageous over other implementations. Furthermore, there is no intention to be bound by any expressed or implied theory presented in the preceding technical field, background, brief summary or the following detailed description.

This specification includes references to “one embodiment” or “an embodiment.” The appearances of the phrases “in one embodiment” or “in an embodiment” do not necessarily refer to the same embodiment. Particular features, structures, or characteristics may be combined in any suitable manner consistent with this disclosure.

Terminology. The following paragraphs provide definitions or context for terms found in this disclosure (including the appended claims):

“Comprising.” This term is open-ended. As used in the appended claims, this term does not foreclose additional structure or operations.

“Configured To.” Various units or components may be described or claimed as “configured to” perform a task or tasks. In such contexts, “configured to” is used to connote structure by indicating that the units or components include structure that performs those task or tasks during operation. As such, the unit or component can be said to be configured to perform the task even when the specified unit or component is not currently operational (e.g., is not on or active). Reciting that a unit or circuit or component is “configured to” perform one or more tasks is expressly intended not to invoke 35 U.S.C. § 112, sixth paragraph, for that unit or component.

“First,” “Second,” etc. As used herein, these terms are used as labels for nouns that they precede, and do not imply any type of ordering (e.g., spatial, temporal, logical, etc.).

“Coupled”—The following description refers to elements or nodes or features being “coupled” together. As used herein, unless expressly stated otherwise, “coupled” means that one element or node or feature is directly or indirectly joined to (or directly or indirectly communicates with) another element or node or feature, and not necessarily mechanically.

In addition, certain terminology may also be used in the following description for the purpose of reference only, and thus are not intended to be limiting. For example, terms such as “upper”, “lower”, “above”, and “below” refer to directions in the drawings to which reference is made. Terms such as “front”, “back”, “rear”, “side”, “outboard”, and “inboard” describe the orientation or location or both of portions of the component within a consistent but arbitrary frame of reference which is made clear by reference to the text and the associated drawings describing the component under discussion. Such terminology may include the words specifically mentioned above, derivatives thereof, and words of similar import.

“Inhibit”—As used herein, inhibit is used to describe a reducing or minimizing effect. When a component or feature is described as inhibiting an action, motion, or condition it may completely prevent the result or outcome or future state completely. Additionally, “inhibit” can also refer to a reduction or lessening of the outcome, performance, or effect which might otherwise occur. Accordingly, when a component, element, or feature is referred to as inhibiting a result or state, it need not completely prevent or eliminate the result or state.

Embodiments described herein may be directed to front-end-of-line (FEOL) semiconductor processing and structures. FEOL is the first portion of integrated circuit (IC) fabrication where the individual devices (e.g., transistors, capacitors, resistors, etc.) are patterned in the semiconductor substrate or layer. FEOL generally covers everything up to (but not including) the deposition of metal interconnect layers. Following the last FEOL operation, the result is typically a wafer with isolated transistors (e.g., without any wires).

Embodiments described herein may be directed to back-end-of-line (BEOL) semiconductor processing and structures. BEOL is the second portion of IC fabrication where the individual devices (e.g., transistors, capacitors, resistors, etc.) get interconnected with wiring on the wafer, e.g., the metallization layer or layers. BEOL includes contacts, insulating layers (dielectrics), metal levels, and bonding sites for chip-to-package connections. In the BEOL part of the fabrication stage contacts (pads), interconnect wires, vias and dielectric structures are formed. For modern IC processes, more than 10 metal layers may be added in the BEOL.

Embodiments described below may be applicable to FEOL processing and structures, BEOL processing and structures, or both FEOL and BEOL processing and structures. In particular, although an exemplary processing scheme may be illustrated using a FEOL processing scenario, such approaches may also be applicable to BEOL processing. Likewise, although an exemplary processing scheme may be illustrated using a BEOL processing scenario, such approaches may also be applicable to FEOL processing.

One or more embodiments may be implemented to realize a 3D ferroelectric RAM (FRAM, FeRAM, or F-RAM) to potentially increase monolithic integration of backend logic plus memory in SoCs of future technology nodes. To provide context, a FRAM is a random-access memory similar in construction to DRAM but uses a ferroelectric layer instead of a dielectric layer to achieve non-volatility. Conventionally, both FRAM and DRAM are one transistor (1T)/one capacitor (1C) cell arrays, where each cell comprises an access transistor in the front end coupled to a single capacitor. The capacitor may be coupled to a bitline (COB) higher in the stack in the semiconductor back end.

As introduced above, conventional memory devices face a variety of challenges, particularly with respect to optimizing device performance. Two such performance characteristics of an IC device include its endurance and wake-up duration. As discussed in more detail below, embodiments of the present disclosure can help to both increase the endurance, and reduce the wake-up duration, for an IC device.

FIG. 1A is a cross-sectional view of an example of an IC structure comprising a capacitor 100. In this example the capacitor structure 100 includes a first electrode 102, a second electrode 104, and a ferroelectric (FE) or anti-ferroelectric (AFE) layer 106 between the first electrode 102 and the second electrode 104. The second electrode 104 is coupled to a metal via 110.

The integrated circuit structure further includes an interfacial high dielectric constant (HiK) layer 108 between the FE or AFE layer 106 and the first electrode 102. Among other things, the interfacial HiK layer 108 helps improve the endurance and reduce the wake-up of ICs (such as memory devices) by mitigating oxygen scavenging by the electrodes, and by inducing favorable crystallization of the FE or AFE layer.

The first electrode 102 and second electrode 104 comprise a metallic material. The first and second electrodes 102, 104 may comprise any suitable metallic material, the electrodes may not necessarily comprise the same material or combination of materials. In some embodiments, either or both electrodes may comprise TiN.

The FE or AFE layer 106 may act as a dielectric layer between the first and second electrodes 102, 104, and may comprise any suitable material. In some embodiments, for example, the FE or AFE layer 106 may comprise HZO.

As noted above, the interfacial HiK layer 108 helps improve the endurance and reduce the wake-up of ICs. The interfacial HiK layer 108 may comprise any suitable HiK material or combination of materials, including SrTiO, CaO, BaO, Al2O3, ZrO2, HfO2, Y2O3, La2O3, TiOx TaOx, or BaTiO.

Figures 1B, 1C:
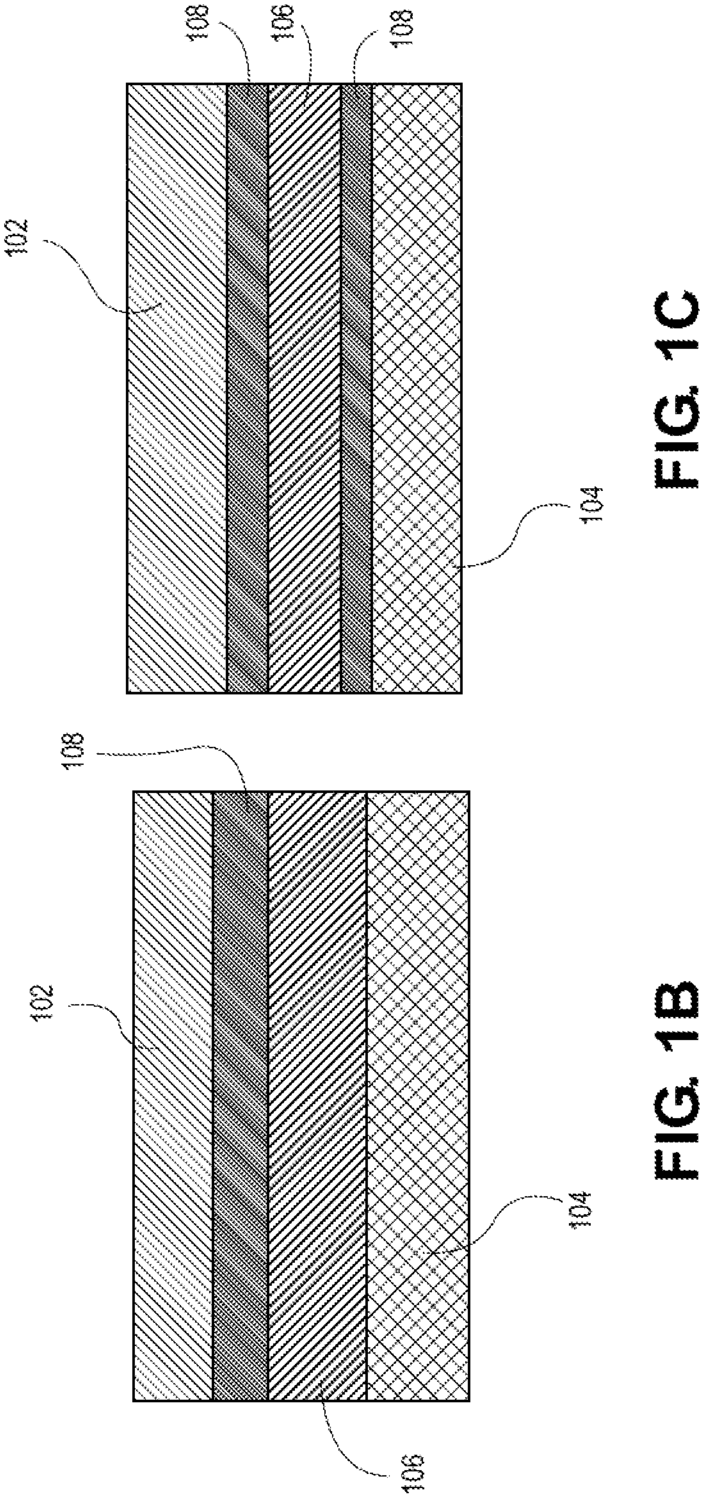

FIGS. 1B and 1C are cross-sectional views of IC structure embodiments utilizing interfacial HiK layers. FIG. 1B, for example, illustrates an example where a single interfacial HiK layer 108 is located between the first electrode 102 and the FE or AFE layer 106. No interfacial HiK layer 108 is located between the second electrode 104 and FE or AFE layer 106.

FIG. 1C, by comparison, illustrates an embodiment where there is a first interfacial HiK layer 108 between the first electrode 102 and the FE or AFE layer 106, and a second interfacial HiK layer 108 between the second electrode 104 and the FE or AFE layer 106, as is shown in FIG. 1A as well.

Implementations of embodiments of the invention may be formed or carried out on a substrate, such as a semiconductor substrate. In one implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. Although a few examples of materials from which the substrate may be formed are described here, any material that may serve as a foundation upon which a semiconductor device may be built falls within the spirit and scope of the present invention.

A plurality of transistors, such as metal-oxide-semiconductor field-effect transistors (MOSFET or simply MOS transistors), may be fabricated on the substrate. In various implementations of the invention, the MOS transistors may be planar transistors, nonplanar transistors, or a combination of both. Nonplanar transistors include FinFET transistors such as double-gate transistors and tri-gate transistors, and wrap-around or all-around gate transistors such as nanoribbon and nanowire transistors. Although the implementations described herein may illustrate only planar transistors, it should be noted that the invention may also be carried out using nonplanar transistors.

Each MOS transistor includes a gate stack formed of at least two layers, a gate dielectric layer and a gate electrode layer. The gate dielectric layer may include one layer or a stack of layers. The one or more layers may include silicon oxide, silicon dioxide ($SiO_2$) and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used.

The gate electrode layer is formed on the gate dielectric layer and may consist of at least one P-type workfunction metal or N-type workfunction metal, depending on whether the transistor is to be a PMOS or an NMOS transistor. In some implementations, the gate electrode layer may consist of a stack of two or more metal layers, where one or more metal layers are workfunction metal layers and at least one metal layer is a fill metal layer.

For a PMOS transistor, metals that may be used for the gate electrode include, but are not limited to, ruthenium, palladium, platinum, cobalt, nickel, and conductive metal oxides, e.g., ruthenium oxide. A P-type metal layer will enable the formation of a PMOS gate electrode with a workfunction that is between about 4.9 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode with a workfunction that is between about 3.9 eV and about 4.2 eV.

In some implementations, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further implementations of the invention, the gate electrode may consist of a combination of U-shaped structures and planar, non-U-shaped structures. For example, the gate electrode may consist of one or more U-shaped metal layers formed atop one or more planar, non-U-shaped layers.

In some implementations of the invention, a pair of sidewall spacers may be formed on opposing sides of the gate stack that bracket the gate stack. The sidewall spacers may be formed from a material such as silicon nitride, silicon oxide, silicon carbide, silicon nitride doped with carbon, and silicon oxynitride. Processes for forming sidewall spacers are well known in the art and generally include deposition and etching process steps. In an alternate implementation, a plurality of spacer pairs may be used, for instance, two pairs, three pairs, or four pairs of sidewall spacers may be formed on opposing sides of the gate stack.

As is well known in the art, source and drain regions are formed within the substrate adjacent to the gate stack of each MOS transistor. The source and drain regions are generally formed using either an implantation/diffusion process or an etching/deposition process. In the former process, dopants such as boron, aluminum, antimony, phosphorous, or arsenic may be ion-implanted into the substrate to form the source and drain regions. An annealing process that activates the dopants and causes them to diffuse further into the substrate typically follows the ion implantation process. In the latter process, the substrate may first be etched to form recesses at the locations of the source and drain regions. An epitaxial deposition process may then be carried out to fill the recesses with material that is used to fabricate the source and drain regions. In some implementations, the source and drain regions may be fabricated using a silicon alloy such as silicon germanium or silicon carbide. In some implementations the epitaxially deposited silicon alloy may be doped in situ with dopants such as boron, arsenic, or phosphorous. In further embodiments, the source and drain regions may be formed using one or more alternate semiconductor materials such as germanium or a group III-V material or alloy. And in further embodiments, one or more layers of metal and/or metal alloys may be used to form the source and drain regions.

One or more interlayer dielectrics (ILD) are deposited over the MOS transistors. The ILD layers may be formed using dielectric materials known for their applicability in integrated circuit structures, such as low-k dielectric materials. Examples of dielectric materials that may be used include, but are not limited to, silicon dioxide ($SiO_2$), carbon doped oxide (CDO), silicon nitride, organic polymers such as perfluorocyclobutane or polytetrafluoroethylene, fluorosilicate glass (FSG), and organosilicates such as silsesquioxane, siloxane, or organosilicate glass. The ILD layers may include pores or air gaps to further reduce their dielectric constant.

Figure 2:
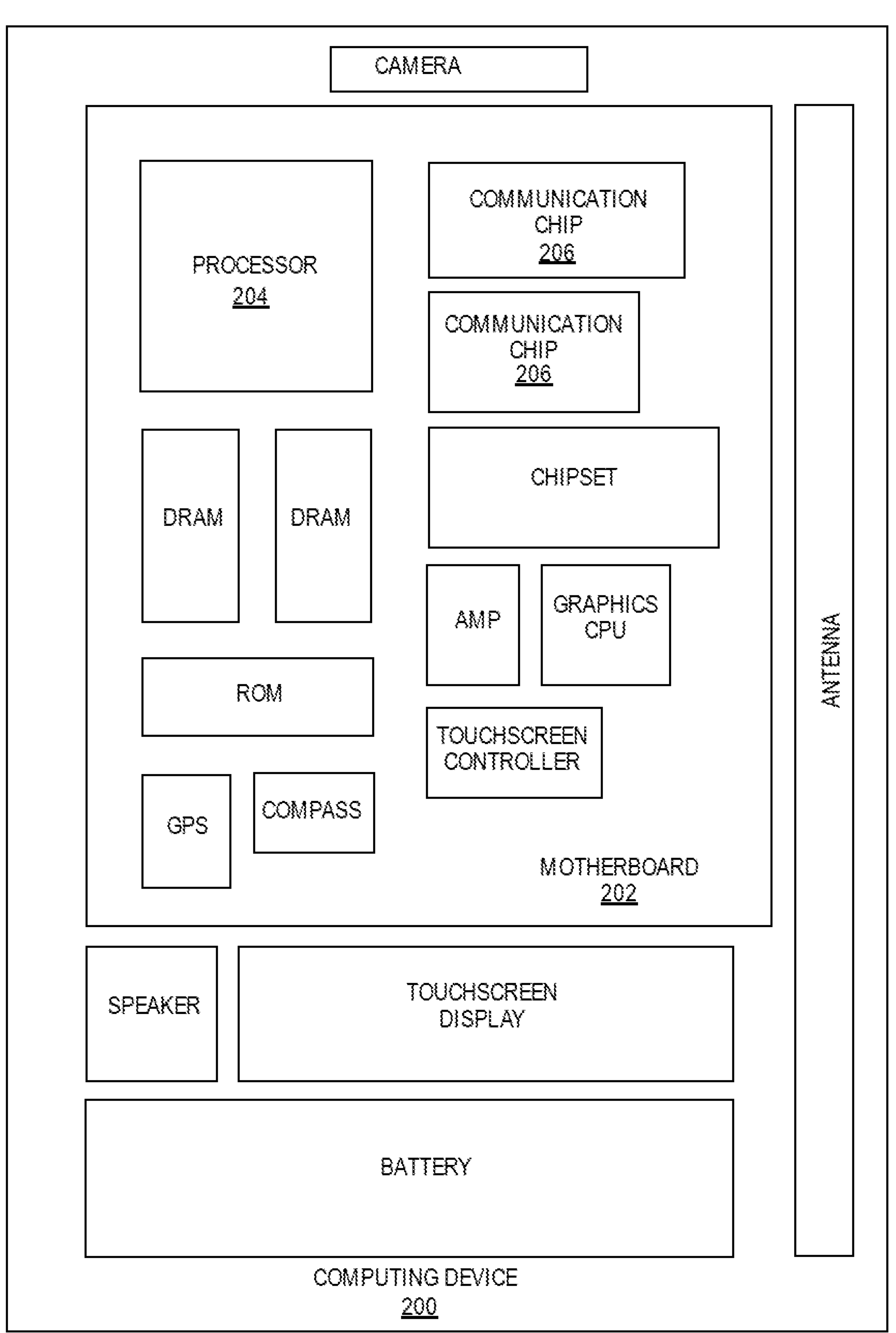
FIG. 2 illustrates an example of a computing device in accordance with various embodiments of the disclosure.

FIG. 2 illustrates a computing device 200 in accordance with one implementation of the invention. The computing device 200 houses a board 202. The board 202 may include a number of components, including but not limited to a processor 204 and at least one communication chip 206. The processor 204 is physically and electrically coupled to the board 202. In some implementations the at least one communication chip 206 is also physically and electrically coupled to the board 202. In further implementations, the communication chip 206 is part of the processor 204.

Depending on its applications, computing device 200 may include other components that may or may not be physically and electrically coupled to the board 202. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 206 enables wireless communications for the transfer of data to and from the computing device 200. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 206 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 200 may include a plurality of communication chips 206. For instance, a first communication chip 206 may be dedicated to shorter range wireless communications such as Wi-Fi and Bluetooth and a second communication chip 206 may be dedicated to longer range wireless communications such as GPS, EDGE, GPRS, CDMA, WiMAX, LTE, Ev-DO, and others.

The processor 204 of the computing device 200 includes an integrated circuit die packaged within the processor 204. In some implementations of the invention, the integrated circuit die of the processor includes one or more devices, such as MOS-FET transistors built in accordance with implementations of the invention. The term "processor" may refer to any device or portion of a device that processes electronic data from registers and/or memory to transform that electronic data into other electronic data that may be stored in registers and/or memory.

The communication chip 206 also includes an integrated circuit die packaged within the communication chip 206. In accordance with another implementation of the invention, the integrated circuit die of the communication chip includes one or more devices, such as MOS-FET transistors built in accordance with implementations of the invention.

In further implementations, another component housed within the computing device 200 may contain an integrated circuit die that includes one or more devices, such as MOS-FET transistors built in accordance with implementations of the invention.

In various implementations, the computing device 200 may be a laptop, a netbook, a notebook, an ultrabook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, or a digital video recorder. In further implementations, the computing device 200 may be any other electronic device that processes data.

Figure 3:
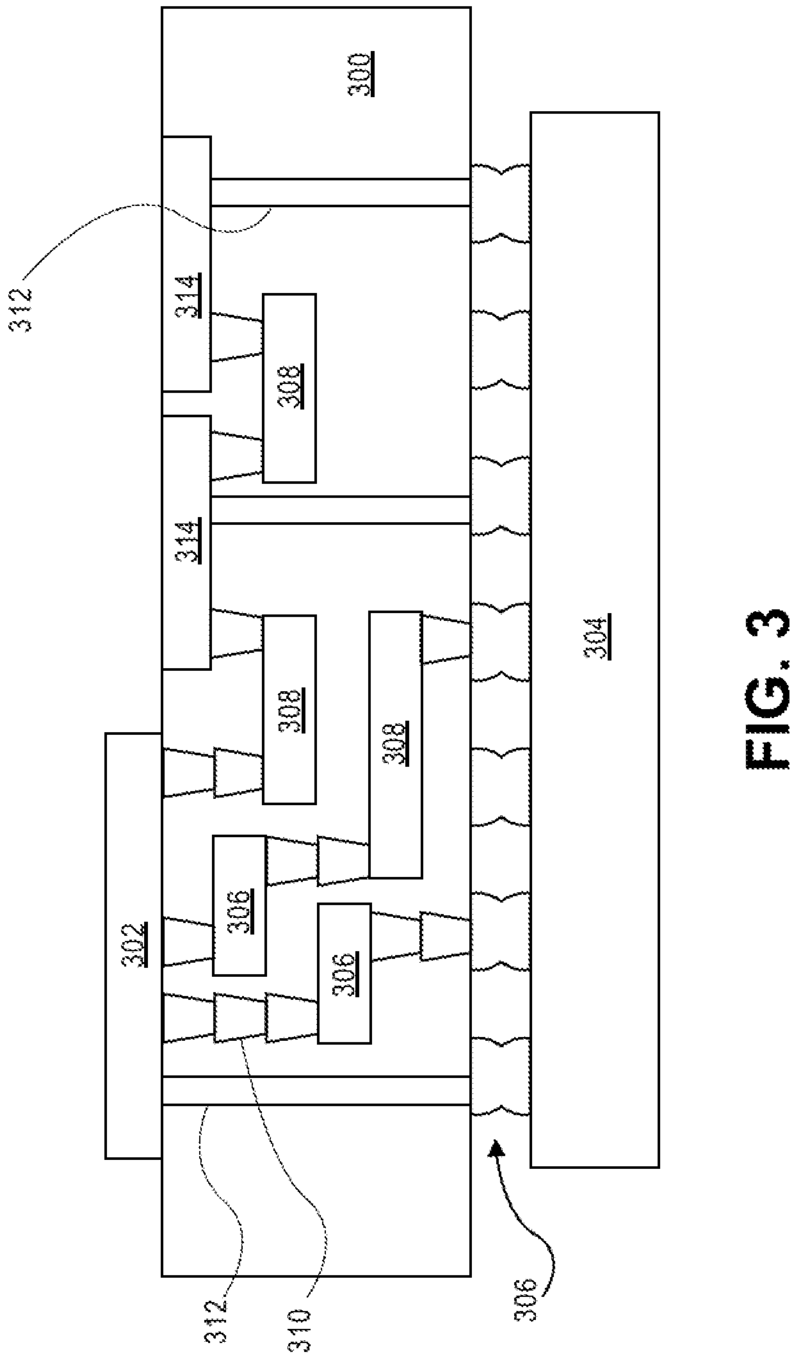
FIG. 3 illustrates an example of an interposer that includes one or more embodiments of the disclosure.

FIG. 3 illustrates an interposer 300 that includes one or more embodiments of the invention. The interposer 300 is an intervening substrate used to bridge a first substrate 302 to a second substrate 304. The first substrate 302 may be, for instance, an integrated circuit die. The second substrate 304 may be, for instance, a memory module, a computer motherboard, or another integrated circuit die. Generally, the purpose of an interposer 300 is to spread a connection to a wider pitch or to reroute a connection to a different connection. For example, an interposer 300 may couple an integrated circuit die to a ball grid array (BGA) 306 that can subsequently be coupled to the second substrate 304. In some embodiments, the first and second substrates 302/304 are attached to opposing sides of the interposer 300. In other embodiments, the first and second substrates 302/304 are attached to the same side of the interposer 300. And in further embodiments, three or more substrates are interconnected by way of the interposer 300.

The interposer 300 may be formed of an epoxy resin, a fiberglass-reinforced epoxy resin, a ceramic material, or a polymer material such as polyimide. In further implementations, the interposer 300 may be formed of alternate rigid or flexible materials that may include the same materials described above for use in a semiconductor substrate, such as silicon, germanium, and other group III-V and group IV materials.

The interposer 300 may include metal interconnects 308 and vias 310, including but not limited to through-silicon vias (TSVs) 312. The interposer 300 may further include embedded devices 314, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 300. In accordance with embodiments of the invention, apparatuses or processes disclosed herein may be used in the fabrication of interposer 300.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of the present disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of the present application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

The following examples pertain to further embodiments. The various features of the different embodiments may be variously combined with some features included and others excluded to suit a variety of different applications.

Example embodiment 1 includes an integrated circuit structure, comprising: a first electrode; a second electrode; a ferroelectric (FE) or anti-ferroelectric (AFE) layer between the first electrode and the second electrode; and an interfacial high dielectric constant (HiK) layer between the FE or AFE layer and the first electrode.

Example embodiment 2 includes the integrated circuit structure of Example embodiment 1 or some other example herein, wherein the first electrode comprises TiN.

Example embodiment 3 includes the integrated circuit structure of Example embodiment 1 or some other example herein, wherein the second electrode comprises TiN.

Example embodiment 4 includes the integrated circuit structure of Example embodiment 1 or some other example herein, wherein the FE or AFE layer is an FE layer comprising HZO.

Example embodiment 5 includes the integrated circuit structure of Example embodiment 1 or some other example herein, wherein the second electrode is coupled to a metal via.

Example embodiment 6 includes the integrated circuit structure of any of Example embodiments 1-5 or some other example herein, wherein the interfacial HiK layer comprises: SrTiO, CaO, BaO, Al2O3, ZrO2, HfO2, Y2O3, La2O3, TiOx TaOx, or BaTiO.

Example embodiment 7 includes the integrated circuit structure of Example embodiment 1 or some other example herein, wherein the interfacial HiK layer is a first interfacial HiK layer, and the integrated circuit structure further includes a second interfacial HiK layer between the second electrode and the FE or AFE layer.

Example embodiment 8 includes an integrated circuit structure, comprising: a first electrode; a second electrode; a ferroelectric (FE) or anti-ferroelectric (AFE) layer between the first electrode and the second electrode; a first interfacial high dielectric constant (HiK) layer between the FE or AFE layer and the first electrode; and a second interfacial HiK layer between the second electrode and the FE or AFE layer.

Example embodiment 9 includes the integrated circuit structure of Example embodiment 8 or some other example herein, wherein the first electrode comprises TiN.

Example embodiment 10 includes the integrated circuit structure of Example embodiment 8 or some other example herein, wherein the second electrode comprises TiN.

Example embodiment 11 includes the integrated circuit structure of Example embodiment 8 or some other example herein, wherein the FE or AFE layer comprises HZO.

Example embodiment 12 includes the integrated circuit structure of Example embodiment 8 or some other example herein, wherein the second electrode is coupled to a metal via.

Example embodiment 13 includes the integrated circuit structure of any of Example embodiments 8-12 or some other example herein, wherein the first interfacial HiK layer or the second interfacial HiK layer comprises: SrTiO, CaO, BaO, Al2O3, ZrO2, HfO2, Y2O3, La2O3, TiOx TaOx, or BaTiO.

Example embodiment 14 includes a computing device, comprising: a board; and a component coupled to the board, the component including an integrated circuit structure, comprising: a first electrode; a second electrode; a ferroelectric (FE) or anti-ferroelectric (AFE) layer between the first electrode and the second electrode; and an interfacial high dielectric constant (HiK) layer between the FE or AFE layer and the first electrode.

Example embodiment 15 includes the computing device of Example embodiment 14 or some other example herein, wherein the first electrode or the second electrode comprises TiN.

Example embodiment 16 includes the computing device of Example embodiment 14 or some other example herein, further comprising a processor coupled to the board.

Example embodiment 17 includes the computing device of Example embodiment 14 or some other example herein, further comprising a communication chip coupled to the board.

Example embodiment 18 includes the computing device of Example embodiment 14 or some other example herein, further comprising a camera coupled to the board.

Example embodiment 19 includes the computing device of Example embodiment 14 or some other example herein, wherein the component is a packaged integrated circuit die.

Example embodiment 20 includes a computing device, comprising: a board; and a component coupled to the board, the component including an integrated circuit structure, comprising: a first electrode; a second electrode; a ferroelectric (FE) or anti-ferroelectric (AFE) layer between the first electrode and the second electrode; a first interfacial high dielectric constant (HiK) layer between the FE or AFE layer and the first electrode; and a second interfacial HiK layer between the second electrode and the FE or AFE layer.

Example 21 includes the computing device of Example embodiment 20 or some other example herein, further comprising a processor coupled to the board.

Example 22 includes the computing device of Example embodiment 20 or some other example herein, further comprising a communication chip coupled to the board.

Example 23 includes the computing device of Example embodiment 20 or some other example herein, further comprising a camera coupled to the board.

Example 24 includes the computing device of any of Example embodiments 20-23 or some other example herein, wherein the component is a packaged integrated circuit die.

What is claimed is:

1. An integrated circuit structure, comprising:
- a first electrode;
- a second electrode below the first electrode, the second electrode having an uppermost surface above a bottommost surface of the first electrode;
- a ferroelectric (FE) or anti-ferroelectric (AFE) layer between the first electrode and the second electrode, wherein the ferroelectric (FE) or anti-ferroelectric (AFE) layer extends laterally beyond the first electrode and the second electrode, and wherein the second electrode has a bottommost surface below a bottommost surface of the ferroelectric (FE) or anti-ferroelectric (AFE) layer; and
- an interfacial high dielectric constant (HiK) layer between the FE or AFE layer and the first electrode.

2. The integrated circuit structure of claim 1, wherein the first electrode comprises TiN.

3. The integrated circuit structure of claim 1, wherein the second electrode comprises TiN.

4. The integrated circuit structure of claim 1, wherein the FE or AFE layer comprises HZO.

5. The integrated circuit structure of claim 1, wherein the second electrode is coupled to a metal via.

6. The integrated circuit structure of claim 1, wherein the interfacial HiK layer comprises: SrTiO, CaO, BaO, Al2O3, ZrO2, HfO2, Y2O3, La2O3, TiOx TaOx, or BaTiO.

7. The integrated circuit structure of claim 1, wherein the interfacial HiK layer is a first interfacial HiK layer, and the integrated circuit structure further includes a second interfacial HiK layer between the second electrode and the FE or AFE layer.

8. An integrated circuit structure, comprising:
- a first electrode;
- a second electrode below the first electrode, the second electrode having an uppermost surface above a bottommost surface of the first electrode;
- a ferroelectric (FE) or anti-ferroelectric (AFE) layer between the first electrode and the second electrode, wherein the ferroelectric (FE) or anti-ferroelectric (AFE) layer extends laterally beyond the first electrode and the second electrode, and wherein the second electrode has a bottommost surface below a bottommost surface of the ferroelectric (FE) or anti-ferroelectric (AFE) layer;
- a first interfacial high dielectric constant (HiK) layer between the FE or AFE layer and the first electrode; and
- a second interfacial HiK layer between the second electrode and the FE or AFE layer.

9. The integrated circuit structure of claim 8, wherein the first electrode comprises TiN.

10. The integrated circuit structure of claim 8, wherein the second electrode comprises TiN.

11. The integrated circuit structure of claim 8, wherein the FE or AFE layer comprises HZO.

12. The integrated circuit structure of claim 8, wherein the second electrode is coupled to a metal via.

13. The integrated circuit structure of claim 8, wherein the first interfacial HiK layer or the second interfacial HiK layer comprises: SrTiO, CaO, BaO, Al2O3, ZrO2, HfO2, Y2O3, La2O3, TiOx TaOx, or BaTiO.

14. A computing device, comprising:
- a board; and
- a component coupled to the board, the component including an integrated circuit structure, comprising:
  - a first electrode;
  - a second electrode below the first electrode, the second electrode having an uppermost surface above a bottommost surface of the first electrode;

a ferroelectric (FE) or anti-ferroelectric (AFE) layer between the first electrode and the second electrode, wherein the ferroelectric (FE) or anti-ferroelectric (AFE) layer extends laterally beyond the first electrode and the second electrode, and wherein the second electrode has a bottommost surface below a bottommost surface of the ferroelectric (FE) or anti-ferroelectric (AFE) layer; and an interfacial high dielectric constant (HiK) layer between the FE or AFE layer and the first electrode.

15. The computing device of claim 14, wherein the first electrode or the second electrode comprises TiN.

16. The computing device of claim 14, further comprising a processor coupled to the board.

17. The computing device of claim 14, further comprising a communication chip coupled to the board.

18. The computing device of claim 14, further comprising a camera coupled to the board.

19. The computing device of claim 14, wherein the component is a packaged integrated circuit die.

20. A computing device, comprising:

a board; and a component coupled to the board, the component including an integrated circuit structure, comprising:

a first electrode;

a second electrode below the first electrode, the second electrode having an uppermost surface above a bottommost surface of the first electrode;

a ferroelectric (FE) or anti-ferroelectric (AFE) layer between the first electrode and the second electrode, wherein the ferroelectric (FE) or anti-ferroelectric (AFE) layer extends laterally beyond the first electrode and the second electrode, and wherein the second electrode has a bottommost surface below a bottommost surface of the ferroelectric (FE) or anti-ferroelectric (AFE) layer;

a first interfacial high dielectric constant (HiK) layer between the FE or AFE layer and the first electrode; and a second interfacial HiK layer between the second electrode and the FE or AFE layer.

21. The computing device of claim 20, further comprising a processor coupled to the board.

22. The computing device of claim 20, further comprising a communication chip coupled to the board.

23. The computing device of claim 20, further comprising a camera coupled to the board.

24. The computing device of claim 20, wherein the component is a packaged integrated circuit die.

* * * * *